(12) United States Patent
Karda et al.

(10) Patent No.: US 12,745,401 B2
(45) Date of Patent: Sep. 22, 2026

(54) MEMORY DEVICE INCLUDING TIERS OF FEFET MEMORY CELLS AND VERTICAL CONTROL GATES

(71) Applicant: Micron Technology, Inc., Boise, ID (US)

(72) Inventors: Kamal M. Karda, Boise, ID (US); Durai Vishak Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 360 days.

(21) Appl. No.: 18/520,002

(22) Filed: Nov. 27, 2023

(65) Prior Publication Data

US 2024/0188302 A1 Jun. 6, 2024

Related U.S. Application Data

(60) Provisional application No. 63/429,817, filed on Dec. 2, 2022.

(51) Int. Cl.
*H10B 51/20* (2023.01)
*H10B 41/10* (2023.01)
(Continued)

(52) U.S. Cl.
CPC ............. *H10B 51/20* (2023.02); *H10B 41/10* (2023.02); *H10B 41/20* (2023.02); *H10B 51/10* (2023.02)

(58) Field of Classification Search
CPC ........ H10B 51/20; H10B 41/10; H10B 41/20; H10B 51/10; H10B 41/27; H10D 64/035; H10D 64/033
See application file for complete search history.

(56) References Cited

U.S. PATENT DOCUMENTS 11,864,475 B2 * 1/2024 Graettinger .......... H10N 70/066
12,219,784 B2 * 2/2025 Fratin .................. H10N 70/231
(Continued)

FOREIGN PATENT DOCUMENTS

WO 2021246825 12/2021
WO 2024118502 6/2024

OTHER PUBLICATIONS

"International Application Serial No. PCT US2023 081156, International Search Report mailed Mar. 29, 2024", 4 pgs.
(Continued)

*Primary Examiner* — Tuyen K Vo
(74) *Attorney, Agent, or Firm* — Schwegman Lundberg & Woessner, P.A.

(57) ABSTRACT

Some embodiments include apparatuses and methods of forming the apparatuses. One of the apparatuses includes a conductive structure; a ferroelectric portion encircling the conductive structure; a charge storage structure encircling the ferroelectric portion; a dielectric portion encircling the charge storage structure; a semiconductor portion encircling the dielectric portion; a first additional conductive structure adjacent a first side of the semiconductor portion; and a second additional conductive structure adjacent a second side of the semiconductor portion, wherein a direction from the first additional conductive structure to the second additional conductive structure is perpendicular to a direction of a length of the conductive structure.

27 Claims, 17 Drawing Sheets

(51) Int. Cl.

| | |
|---|---|
| ***H10B 41/20*** | (2023.01) |
| ***H10B 51/10*** | (2023.01) |

(56) References Cited

U.S. PATENT DOCUMENTS

| | | | | |
|---|---|---|---|---|
| 12,245,426 | B2 * | 3/2025 | Scarbrough | H10B 43/20 |
| 12,308,333 | B2 * | 5/2025 | Simsek-Ege | H01L 25/0657 |
| 12,336,185 | B2 * | 6/2025 | Cook | H10D 1/716 |
| 2018/0197864 | A1 * | 7/2018 | Sills | H10B 12/31 |
| 2018/0203613 | A1 | 7/2018 | Tanzawa | |
| 2020/0357821 | A1 | 11/2020 | Chen | |
| 2021/0202703 | A1 | 7/2021 | Rajashekhar et al. | |
| 2022/0285394 | A1 | 9/2022 | Ling et al. | |
| 2022/0384719 | A1 * | 12/2022 | Fratin | H10N 70/882 |

OTHER PUBLICATIONS

"International Application Serial No. PCT US2023 081156, Written Opinion mailed Mar. 29, 2024", 4 pgs.

"European Application Serial No. 23898637.6, Response to Communication pursuant to Rules 161(2) and 162 EPC filed Jan. 12, 2026", 13 pgs.

* cited by examiner

100

100

8A
8A
104
105
106
101
102
103
121
122
123
124
125
100

MEMORY DEVICE INCLUDING TIERS OF FEFET MEMORY CELLS AND VERTICAL CONTROL GATES

PRIORITY APPLICATION

This application claims the benefit of priority to U.S. Provisional Application Ser. No. 63/429,817, filed Dec. 2, 2022, which is incorporated herein by reference in its entirety.

BACKGROUND

Ferroelectric field-effect transistor (FeFET) is type of transistor in which a gate dielectric is formed from ferroelectric materials instead of a traditional silicon dioxide. Many conventional FeFET structures are available. However, some FeFET structures still face one or more challenges associated with operating voltage, parasitic capacitance between word lines and bit lines, and reliability.

BRIEF DESCRIPTION OF THE DRAWINGS

FIG. 4A and FIG. 4B through FIG. 10A and FIG. 10B show different views of elements during processes of forming the memory device of FIG. 1, FIG. 2, and FIG. 3, according to some embodiments described herein.

DETAILED DESCRIPTION

The memory device described herein involves a FeFET memory device having tiers of FeFET memory cells. The tiers are located (e.g., stacked) one over another over a substrate (e.g., a semiconductor substrate) of the memory device. The described memory device includes vertical conductive structures (e.g., pillars) extending through the tiers. The vertical conductive structures are part of access lines (e.g., word lines) and can form control gates (e.g., vertical control gates) of FeFET in the memory cells, which are located along the length of the vertical conductive structures. The described memory device also includes horizontal conductive structures that are part of data lines (e.g., bit lines) of the memory device. Improvements and benefits of the described memory device include relatively low operating voltage, low parasitic capacitance between word lines and data lines, and improved endurance. Other improvements and benefits of the described memory device and its variations are discussed below with reference to FIG. 1 through FIG. 10B.

Figure 1:
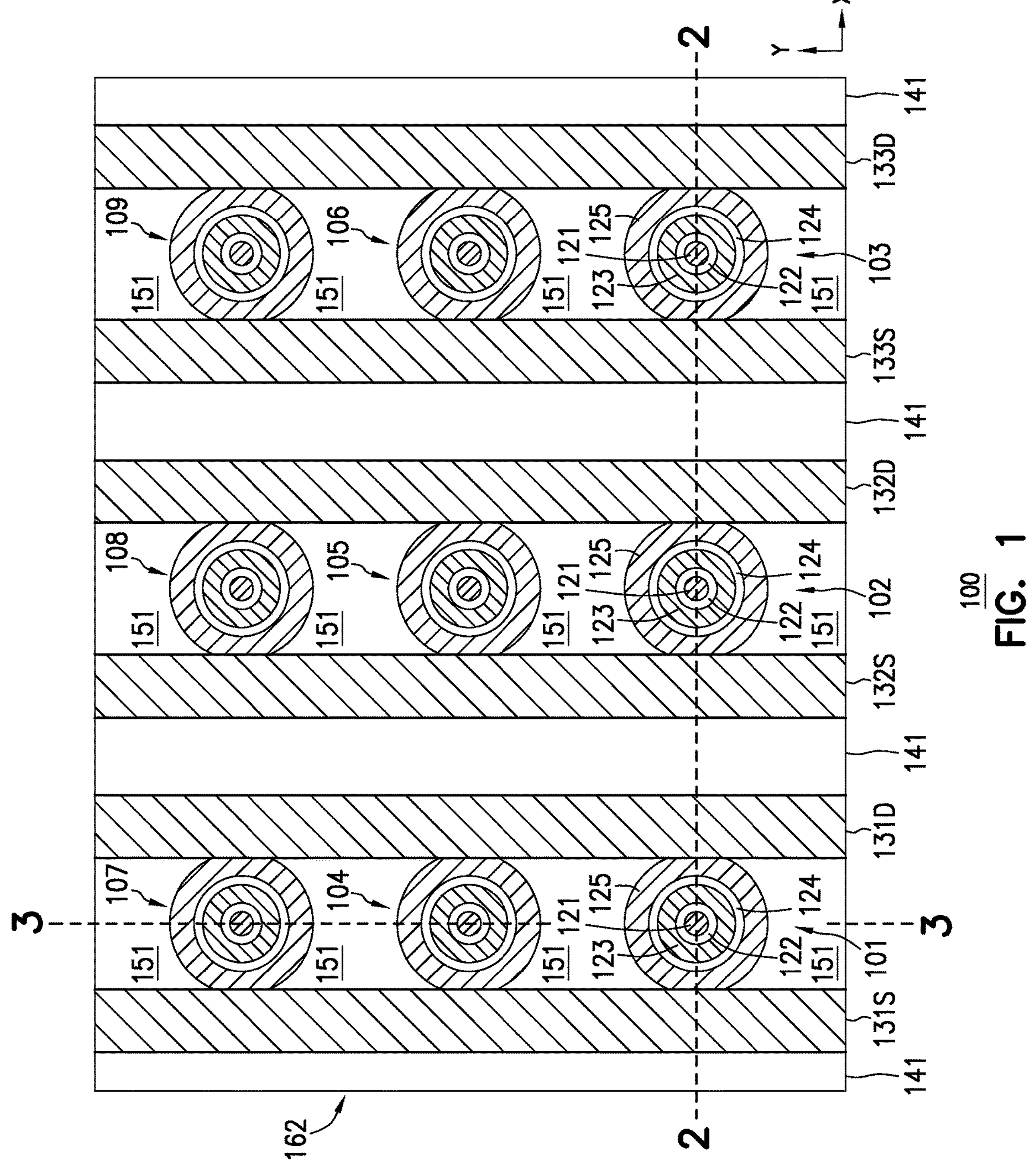
FIG. 1, FIG. 2, and FIG. 3 show different views of an apparatus in the form of a memory device including FeFET memory cells, according to some embodiments described herein.
Figure 2:
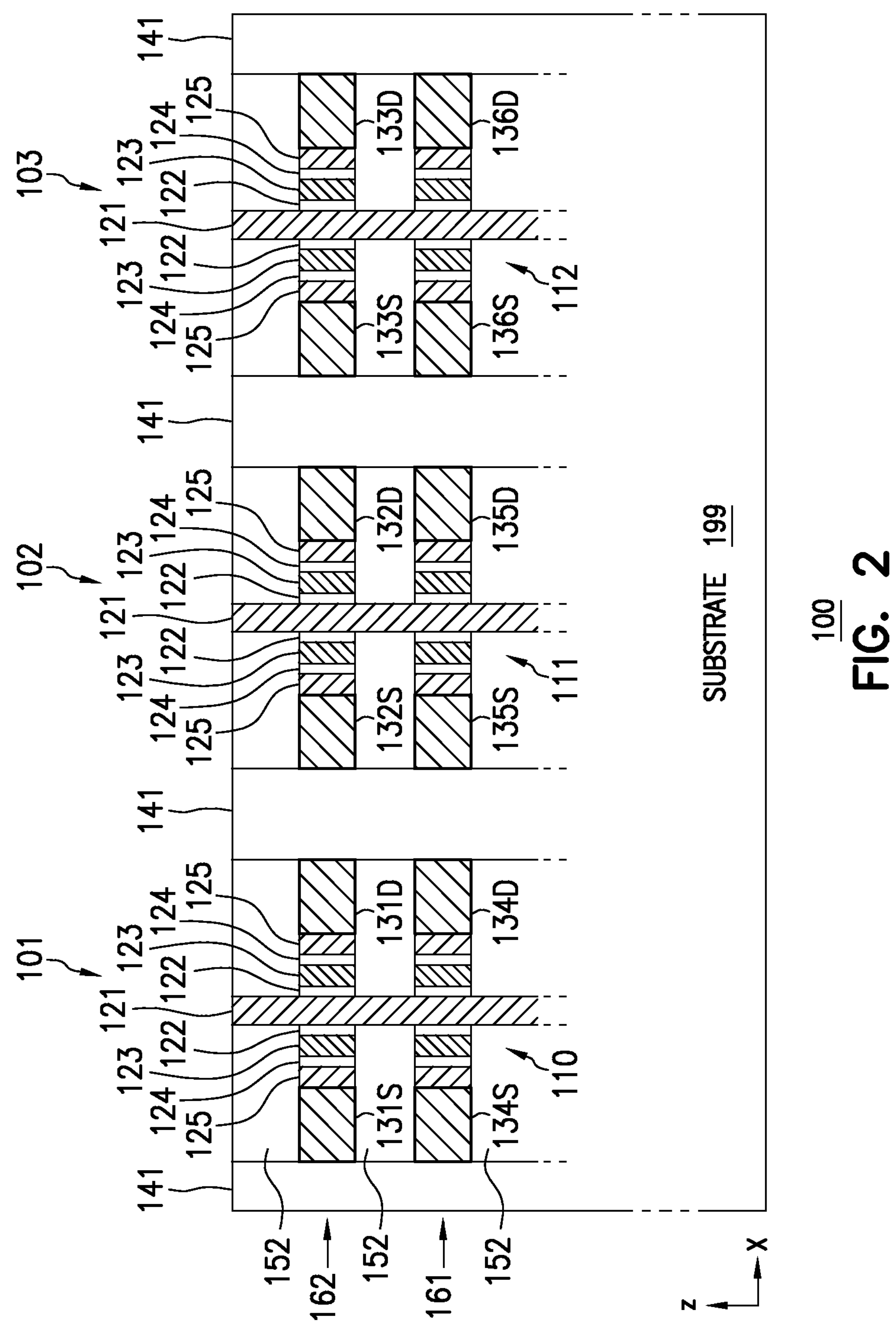
Figure 3:
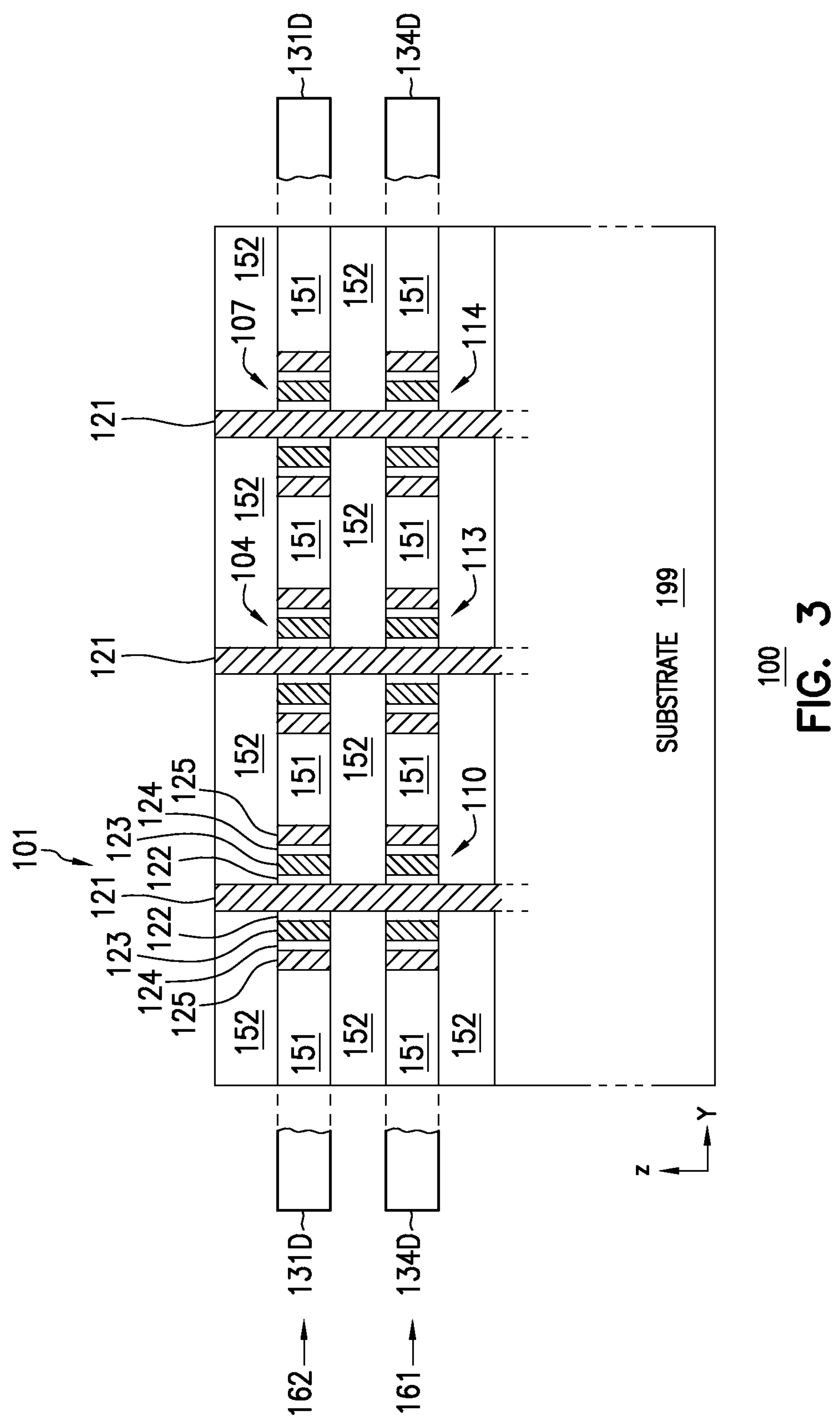

FIG. 1 shows an apparatus in the form of a memory device 100 including memory cells, according to some embodiments described herein. FIG. 1 shows a top view (e.g., plan view) in the X-Y direction of memory device 100. FIG. 2 shows a side view (e.g., cross section) in the X-Z direction of memory device 100 along line 2-2 of FIG. 1. FIG. 3 shows a side view (e.g., another cross section) in the Y-Z direction of memory device 100 along line 3-3 of FIG. 1. As shown in FIG. 1, FIG. 2, and FIG. 3, memory device 100 can include memory cells 101 through 114. The memory cells (e.g., memory cells 101 through 114) of memory device 100 can include a structure of FeFET. As shown in FIG. 1, FIG. 2, and FIG. 3, the memory cells (e.g., memory cells 101 through 114) of memory device 100 can be formed (e.g., arranged) in three dimensions including the X-direction, the Y-direction, and the Z-direction (e.g., a vertical direction). Thus, memory device 100 can be called a 3-D (three-dimension) FeFET memory device.

The following description refers to FIG. 1, FIG. 2, and FIG. 3. FIG. 1 show a top view of a tier 162 (one tier) of memory device 100 that includes memory cells 101 through 109 located (e.g., formed) in the X-Y directions. FIG. 2 and FIG. 3 show two tiers 161 and 162 located (e.g., stacked) one over another in the Z-direction. Memory device 100 can include numerous tiers of memory cells (e.g., up to one hundred tiers or more than one hundred tiers). For simplicity, only two of the tiers of memory device 100 are shown in FIG. 2 and FIG. 3. Other tiers of memory device 100 have elements similar to (or the same as) the elements of tiers 161 and 162.

For simplicity, detailed description of the same elements of memory device 100 is not repeated in the description herein (e.g., FIG. 1 through FIG. 10B). Also for simplicity and ease of viewing, cross-sectional lines (e.g., hatch lines) are omitted from most of the elements shown in FIG. 1, FIG. 2, and FIG. 3 and other figures described herein. Some elements of memory device 100 may be omitted from a particular figure of the drawings so as to not obscure the description of the element (or elements) being described in that particular figure. The dimensions (e.g., physical structures) of the elements shown in the drawings described herein are not scaled.

As shown in FIG. 2 and FIG. 3, memory device 100 can include a substrate 199 over which the memory cells and other elements of memory device 100 are located (e.g., formed). Substrate 199 can include a semiconductor (e.g., silicon) substrate or other types of substrates (e.g., dielectric substrate).

FIG. 1, FIG. 2, and FIG. 3, memory device 100 can include conductive structures 121 extending through tiers in a length in the Z-direction. Example materials for conductive structures 121 include metal, doped polysilicon, or other conductive materials. Thus, as shown FIG. 1, FIG. 2, and FIG. 3, each of conductive structures 121 can have a length in the Z-direction. The Z-direction (e.g., vertical direction) is a direction perpendicular to (e.g., outward from) substrate 199. The Z-direction is also perpendicular to (e.g., extended vertically from) the X-direction (FIG. 2) and perpendicular to the Y-direction (FIG. 3). The X-direction and Y-direction (FIG. 1) are perpendicular to each other. As shown in FIG. 1, FIG. 2, and FIG. 3, each conductive structure 121 can be a pillar structure (e.g., a conductive pillar) that has a circular (or circular-like) cross-section, as shown in FIG. 1.

Conductive structures 121 can be part of access lines (e.g., word lines) that can be used to control access to respective memory cells of memory device 100. Each conductive structure 121 can be associated with respective memory cells (in the Z-direction) of different tiers, such that the memory cells of different tiers can share a respective conductive structure among conductive structures 121. Each conductive structure 121 can form part of a gate (e.g., control gate) of a transistor (e.g., a FeFET) of a memory cell of memory device 100. Thus, the memory cells of different tiers (the FeFETs of different tiers) can share a control gate (e.g., vertical control gate), which is a particular conductive structure 121. The memory cells of different tiers (the FeFETs of different tiers) can be controlled by the same signal (e.g., a word line signal) applied to the shared conductive structure 121 (e.g., shared vertical control gate).

As shown in FIG. 1, memory device 100 can include conductive structures 131S, 131D, 132S, 132D, 133S, and 133D. Example materials for conductive structures 131S, 131D, 132S, 132D, 133S, and 133D includes metal, doped polysilicon, or other conductive materials. As shown in FIG. 1, each of conductive structures 131S, 131D, 132S, 132D, 133S, and 133D can have a length in the Y-direction, which is perpendicular to a direction (Z-direction) of the length of conductive structures 121. As shown in FIG. 2 and FIG. 3, a direction from one tier to another tier (e.g., from tier 161 to tier 162) of memory device 100 is parallel to the Z-direction (e.g., a vertical direction) and parallel to the length of conductive structures 121. Thus, the length of each of conductive structures 131S, 131D, 132S, 132D, 133S, and 133D is also perpendicular to a direction from one tier to another tier (e.g., from tier 161 to tier 162) of memory device 100.

Conductive structures 131S, 131D, 132S, 132D, 133S, and 133D can be part of data lines of memory device 100. The data lines (which include conductive structures 131S, 131D, 132S, 132D, 133S, and 133D) can include bit lines (or also called digit lines). Memory device 100 can use the data lines (which include conductive structures 131S, 131D, 132S, 132D, 133S, and 133D) to read information (e.g., during a read operation) from the memory cells (e.g., memory cells 101 through 114) of memory device 100.

As shown in FIG. 1, each of conductive structures 131S, 131D, 132S, 132D, 133S, and 133D can be adjacent (e.g., can contact) part of respective memory cells in the Y-direction of the same tier (e.g., tier 162 show in FIG. 1). For example, conductive structure 131S can be adjacent a side (e.g., a left side with respect to the view of FIG. 1) of a semiconductor portion 125 (described below) of each of memory cells 101, 104, and 107 and make an electrical contact with memory cells 101, 104, and 107. In another example, conductive structure 131D can be adjacent a side (e.g., a right side with respect to the view of FIG. 1) of semiconductor portion 125 of each of memory cells 101, 104, and 107 and make an electrical contact with memory cells 101, 104, and 107.

In a similar arrangement, semiconductor portion 125 of each of the other memory cells of memory device 100 can also be adjacent and make an electrical contact with two respective conductive structures. As shown in FIG. 1, semiconductor portion 125 of memory cells 102, 105, and 108 can be adjacent and make an electrical contact with conductive structures 132S and 132D. Semiconductor portion 125 of memory cells 103, 106, and 109 can be adjacent and make an electrical contact with conductive structures 133S and 133D.

Part of each conductive structure 121 can form part of a source or a drain of a transistor (e.g., a FeFET) of a memory cell of memory device 100. For example, part of conductive structure 131S can form the source (or part of the source) of the transistor (e.g., a FeFET) of each of memory cells 101, 104, and 107. A part of conductive structure 131D can form the drain (or part of the drain) of the transistor (e.g., a FeFET) of each of memory cells 101, 104, and 107. In the description herein, source and drain of a transistor are used interchangeably.

Similarly, conductive structures 132S and 132D can form the source and drain, respectively, of the transistor (e.g., a FeFET) of each of memory cells 102, 105, and 108. Conductive structures 133S and 133D can form the source and drain, respectively, of the transistor (e.g., a FeFET) of each of memory cells 103, 106, and 109.

As show in FIG. 1, memory device 100 can include dielectric structures 141 that can include a dielectric material (e.g., silicon dioxide). Each dielectric structure 141 can be located (e.g., formed) between and having sides in the X-direction (e.g., left and right sides) adjacent (e.g., contacts) two of conductive structures 131S, 131D, 132S, 132D, 133S, and 133D to separate (electrically separate) the two of conductive structures.

As show in FIG. 1, a direction from one side to another in the X-direction (e.g., left side to right side) of semiconductor portion 125 is perpendicular to a direction from one side to another in the Y-direction (e.g., top side to bottom side) of semiconductor portion 125. As shown in FIG. 1, conductive structures 132S and 132D can be separated from each other (in the X-direction) by respective portions of a dielectric material 151 that are adjacent respective side in the Y-direction (e.g., top and bottom sides with respect to the view of FIG. 1) of semiconductor portion 125. Dielectric material 151 can include silicon dioxide.

Different tiers (e.g., tiers 161 and 162 in FIG. 2 and FIG. 3) of memory device 100 can have conductive structures of different data lines. As shown in FIG. 2, memory device 100 can include conductive structures 134S, 134D, 135S, 135D, 136S, and 136D located in tier 161. Memory cells of different tiers (e.g., tiers 161 and 162) may not share data lines. Thus, conductive structures of the data lines in one tier (e.g., tier 161) are electrically separated conductive structures of data lines in another tier (e.g., tier 162). For example, conductive structures 131S, 131D, 132S, 132D, 133S, and 133D are electrically separated from conductive structures 134S, 134D, 135S, 135D, 136S, and 136D.

Conductive structures 134S, 134D, 135S, 135D, 136S, and 136D can have the same conductive material as conductive structures 131S, 131D, 132S, 132D, 133S, and 133D. As shown in FIG. 2 and FIG. 3, each of conductive structures 134S, 134D, 135S, 135D, 136S, and 136D can be adjacent (e.g., contact) part of respective memory cells of tier 161. For example, conductive structure 134D (partially shown in FIG. 3) can be adjacent and make an electrical contact with a side of semiconductor portion 125 (not labeled) of memory cells 110, 113, and 114. In another example, conductive structure 131D (partially shown in FIG. 3) can be adjacent and make an electrical contact with a side of semiconductor portion 125 (not labeled) of memory cells 101, 104, and 107. In another example, conductive structures 135S and 135D in FIG. 2 can be adjacent respective sides of semiconductor portion 125 (not labeled) of memory cell 111. Conductive structures 136S and 136D in FIG. 2 can be adjacent respective sides of semiconductor portion 125 (not labeled) of memory cell 112.

The following description describes of a portion of memory cell 101 of memory device 100 in FIG. 1, FIG. 2, and FIG. 3; other memory cells have the similar or the same structure. FIG. 1, shows a top view in the X-Y direction of memory cell 101. FIG. 2 shows a side view (e.g., cross section) in the X-Z direction of memory cell 101 along line 2-2 of FIG. 1. FIG. 3 shows a side view (e.g., another cross section) in the Y-Z direction of memory cell 101 along line 3-3 of FIG. 1.

As shown in FIG. 1, memory cell 101 can include a ferroelectric portion 122 having a ring shape (e.g., a doughnut structure). As shown in the top view in FIG. 1, ferroelectric portion 122 is encircling a portion (e.g., portion at tier 162) of conductive structure 121. Ferroelectric portion 122 includes a ferroelectric material, or another kind of material. Ferroelectric portion 122 can alternatively include a combination of films (e.g., a sandwich of films).

Memory cell 101 (FIG. 1) can include a charge storage structure 123 having a ring shape (e.g., a doughnut structure) with a diameter greater than the diameter of ferroelectric portion 122. As shown in the top view in FIG. 1, charge storage structure 123 is encircling ferroelectric portion 122. Charge storage structure 123 can form a floating gate of the transistor (e.g., a FeFET) of memory cell 101. A portion of conductive structure 121 in tier 162 can form a gate (e.g., a control gate) of the transistor of memory cell 101. Charge storage structure 123 can include a material that can store charge. An example material for charge storage structure 123 includes polysilicon, metal, or other materials. The material (or materials) of charge storage structure 123 can be the same as the material (or materials) of conductive structure 121. Alternatively, the material (or materials) of charge storage structure 123 can be different from the material (or materials) of conductive structure 121.

Memory cell 101 (FIG. 1) can include a dielectric portion 124 having a ring shape (e.g., a doughnut structure) with a diameter greater than the diameter of charge storage structure 123. As shown in the top view in FIG. 1, dielectric portion 124 is encircling the charge storage structure 123. Dielectric portion 124 can include silicon dioxide, a high-k dielectric material, or other dielectric materials. A high-k dielectric material is a dielectric material having a dielectric constant greater than a dielectric constant of silicon dioxide. Dielectric portion 124 can alternatively include a combination of films (e.g., a sandwich of films).

Memory cell 101 (FIG. 1) can include a semiconductor portion 125 having ring shape (e.g., a doughnut structure) with a diameter a greater than the diameter of dielectric portion 124. As shown in the top view in FIG. 1, semiconductor portion 125 is encircling dielectric portion 124. Semiconductor portion 125 can include polysilicon (e.g., undoped polysilicon) or other semiconductor materials.

As shown in FIG. 2 and FIG. 3, memory device 100 can include a dielectric material (e.g., a level of dielectric material) 152 adjacent a side (e.g., top side in FIG. 2 and FIG. 3) of each of ferroelectric portion 122, charge storage structure 123, dielectric portion 124, and semiconductor portion 125. As shown in FIG. 2 and FIG. 3, memory device 100 can also include dielectric material (e.g., another level of dielectric material) 152 adjacent a side (e.g., bottom side in FIG. 2 and FIG. 3) of each of ferroelectric portion 122, charge storage structure 123 dielectric portion 124, and semiconductor portion 125. Dielectric material 152 can include silicon nitride.

Other memory cells of memory device 100 have a structure similar to memory cell 101. As shown in FIG. 2 and FIG. 3, different memory cells can include elements that can encircle different portions (in the Z-direction). For example, the elements of memory cell 110 can encircle a portion of conductive structure 121 in tier 162, and the elements of memory cell 110 can encircle a portion of conductive structure 121 in tier 161 (FIG. 2 and FIG. 3).

As shown in FIG. 2 and FIG. 3, the elements of memory cells associated with (e.g., sharing) the same conductive structure 121 can be separated (e.g., electrically separated) from each other by dielectric material (e.g., silicon nitride) 152. For example, ferroelectric portion 122 of memory cell 101 is separated from ferroelectric portion 122 of memory cell 110 by dielectric material 152. Charge storage structure 123 of memory cell 101 is separated from charge storage structure 123 of memory cell 110 by dielectric material 152. Dielectric portion 124 of memory cell 101 is separated from dielectric portion 124 of memory cell 110 by dielectric material 152. Semiconductor portion 125 of memory cell 101 is separated from semiconductor portion 125 of memory cell 110 by dielectric material 152. Thus, the materials that form the elements of the memory cells associated with the same conductive structure 121 are not continuously formed (e.g., not formed from as a single piece of material) in the Z-direction from one memory cell to another memory cell in the Z-direction.

In operation, information can be stored in the memory cells (e.g., memory cells 101 through 114) of memory device 100 in a write operation (also called a program operation). For example, to store information in memory cell 101, a voltage (e.g., a programming voltage) can be applied to conductive structure 121 (e.g., applied to a word line that includes conductive structure 121) associated with memory cell 101. As described above, conductive structure 121 forms part of the gate of the FeFET of memory cell 101. The value of the voltage (applied to the gate of the FeFET) in a write operation can be based on the value (e.g., digital value) of information to be stored in memory cell 101. The applied voltage can change the polarization state of ferroelectric portion 122 of memory cell 101. Different polarization states can give different read currents between the source and drain of the FeFET of memory cell 101 when memory cell 101 is read.

Information can be read from memory cells 101 through 114 in a read operation. For example, to read information (e.g., previously stored information) in memory cell 101, a voltage can be applied to conductive structure 121. In the structure of the memory cell (e.g., memory cell 109), a current can flow between conductive structures 131S and 131D through semiconductor portion 125 in the X-direction (e.g., perpendicular to the length of conductive structure 121). Memory device 100 can include detection circuitry (not shown) that can operate during a read operation to detect (e.g., sense) a current between the data lines associated with a selected memory cell. In this example, the detection circuitry can operate to detect current between the data lines that include conductive structures 131S and 131D (which is coupled to the channel region (e.g., semiconductor portion 125) of the FeFET in memory cell 101 (selected memory cell in this example). Memory device 100 can also include circuitry (not shown) to translate the value of detected current into the value (e.g., "0" or "1") of information stored in memory cell 101. In the structure of the memory cells of memory device 100, information stored in the selected memory cell (e.g., memory cell 101 in this example) remains stored (e.g., is non-destroyed) in the selected memory cell after the read operation is performed on the selected memory cell.

Structuring memory device 100 as described above can provide improvements and benefits over some conventional memory devices. For example, memory device 100 can have a relatively low operating voltage, improved (e.g., reduced) parasitic elements including reduced parasitic capacitance between conductive structures 121 (e.g., word lines) conductive structures 131S, 131D, 132S, 132D, 133S, 133D, 134S, 134D, 135S, 135D, 136S, and 136D (e.g., data lines), and improved endurance. Further, in the structure of memory device 100 as shown in FIG. 1, FIG. 2, and FIG. 3, the read signal window can be mainly based on read current. This can lead to a higher read signal window, higher speed, or both.

Figure 4A:
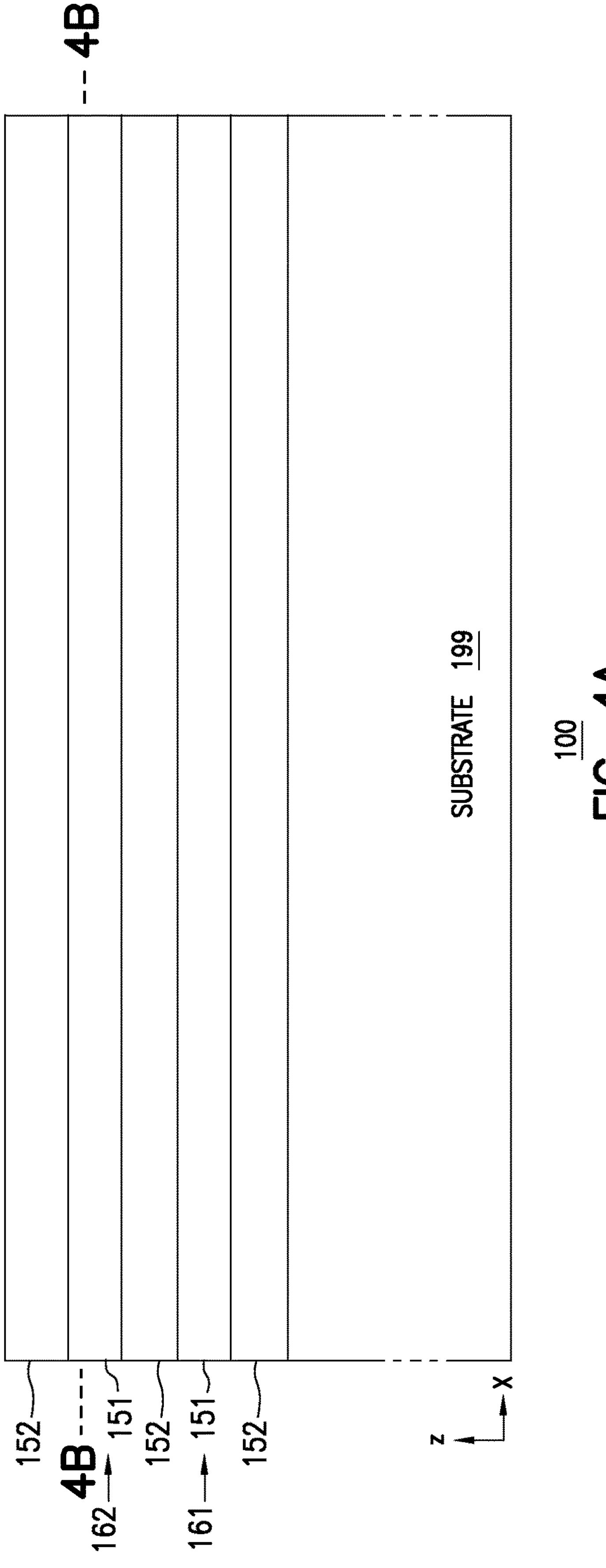
Figure 4B:
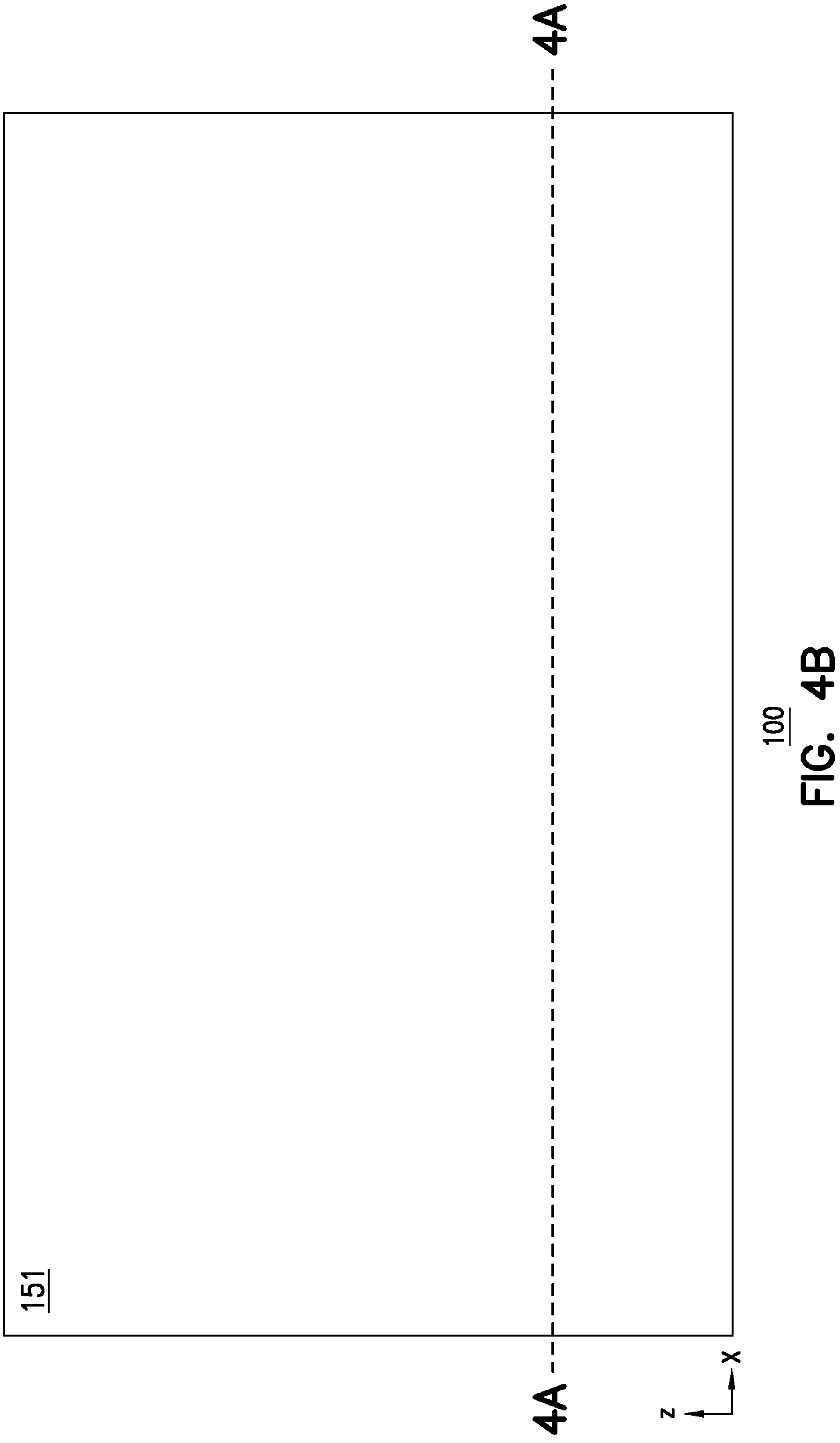

FIG. 4A and FIG. 4B through FIG. 10A and FIG. 10B show different views of elements during processes of forming memory device 100, according to some embodiments described herein. FIG. 4A shows a side view (e.g., cross-section) in the X-direction of memory device 100 after dielectric materials (levels of dielectric materials) 151 and dielectric materials (levels of dielectric materials) 152 are alternatively formed over a substrate 199. Dielectric materials 151 and 152 can be sequentially formed one material after another over substrate 199 in an interleaved fashion, such that dielectric materials 151 are interleaved with dielectric materials 152. FIG. 4B shows a top view of memory device 100 after dielectric materials 151 and 152 are formed.

Figure 5A:
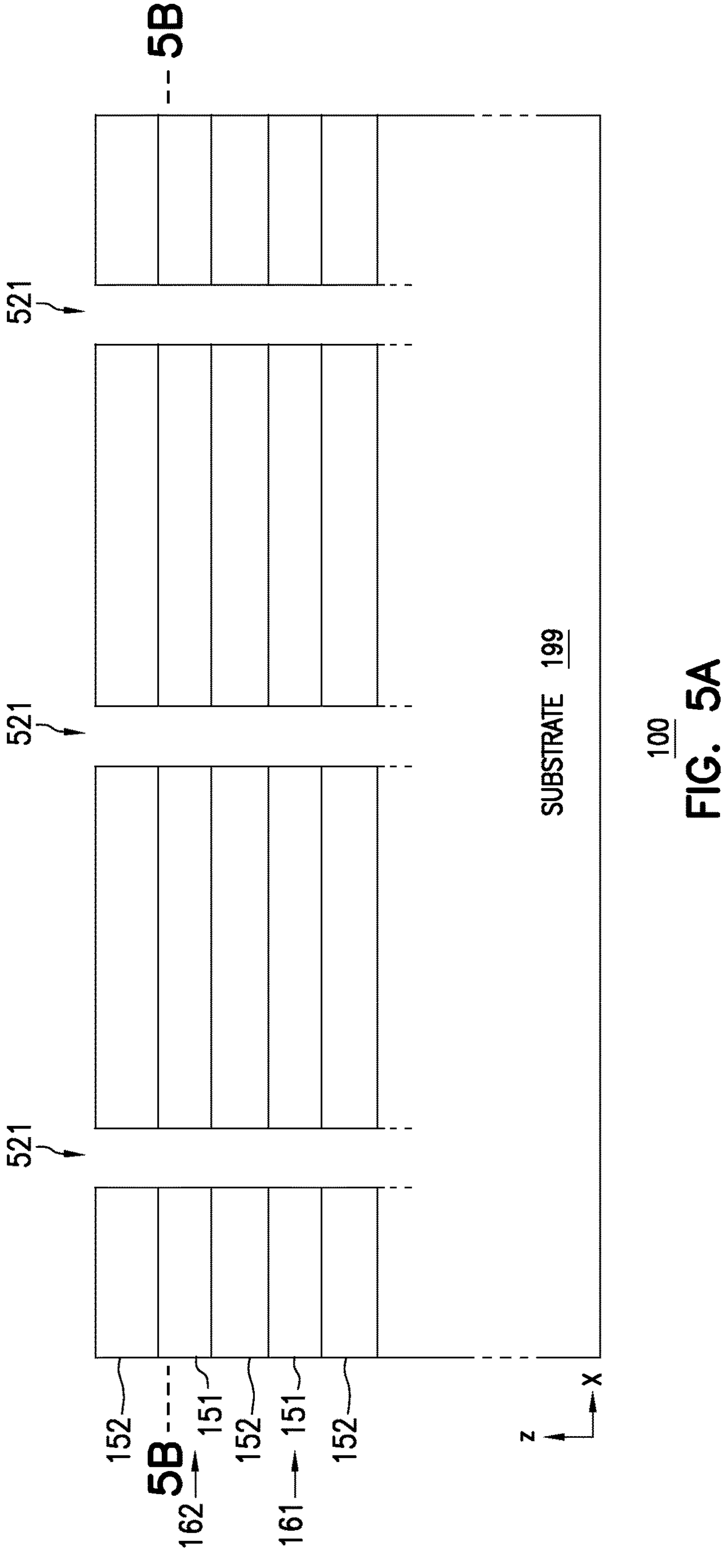
Figure 5B:
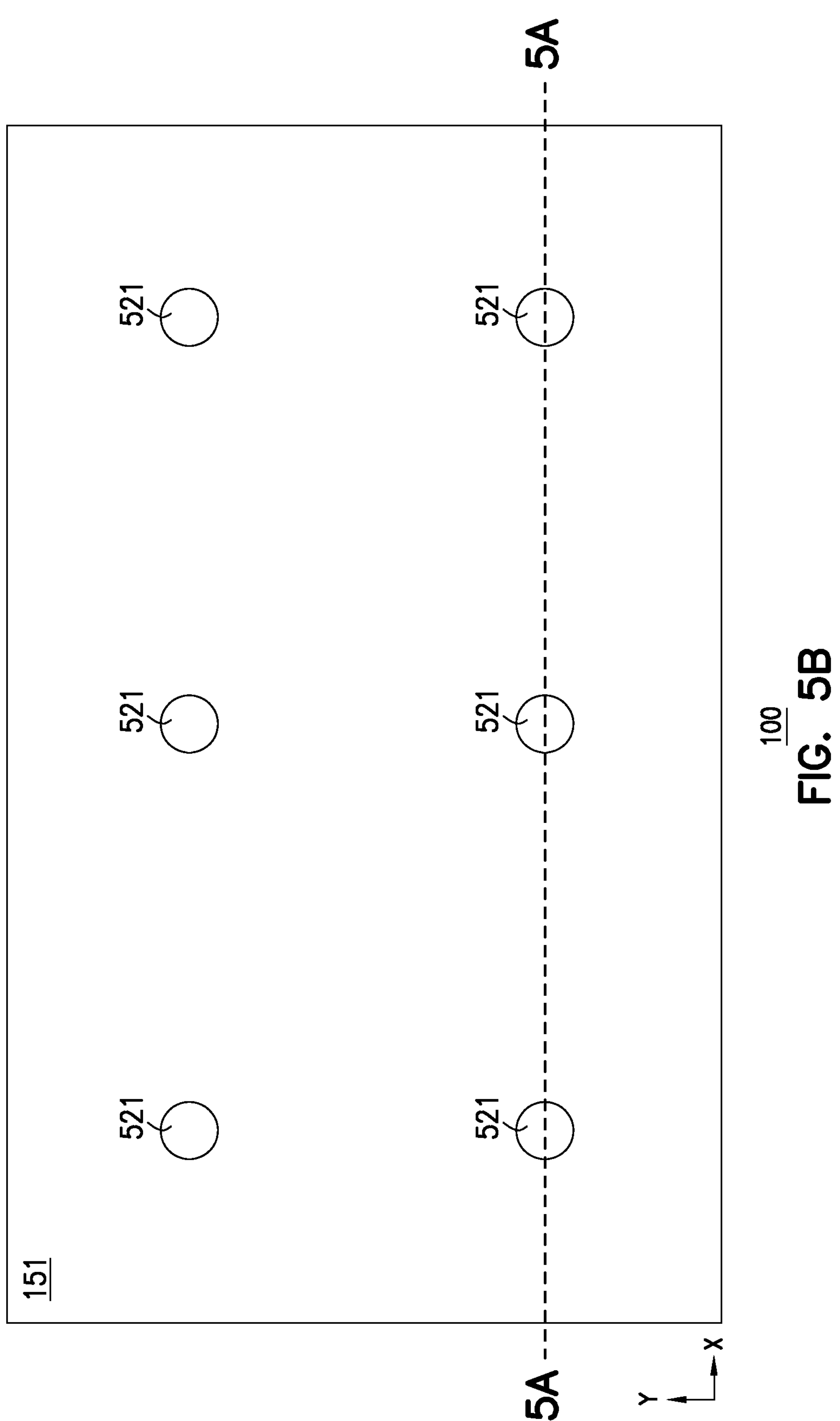

In the following description, different views of memory device 100 in subsequent processes are based on the views of memory device 100 of FIG. 4A and FIG. 4B (e.g., side view and top view). For example, FIG. 5A shows a side view of a portion of memory device 100 taken along line (e.g., cross-section line) 5B-5B of FIG. 5B. FIG. 5B shows a top view of a portion of memory device 100 of FIG. 5A. For simplicity, the following description omits repeating specific views (e.g., side view and top view) and specific cross-section lines of portions of memory device 100 from one process to the next.

FIG. 5A and FIG. 5B show memory device 100 after openings (e.g., holes) 521 are formed in dielectric materials 151 and 152. Forming openings 521 can include removing (e.g., etching) a portion of dielectric materials 151 and 152 at the locations of openings 521. As shown in FIG. 5A, forming openings 521 also exposes respective portions of dielectric materials 151 and 152 at openings 521.

Figure 6A:
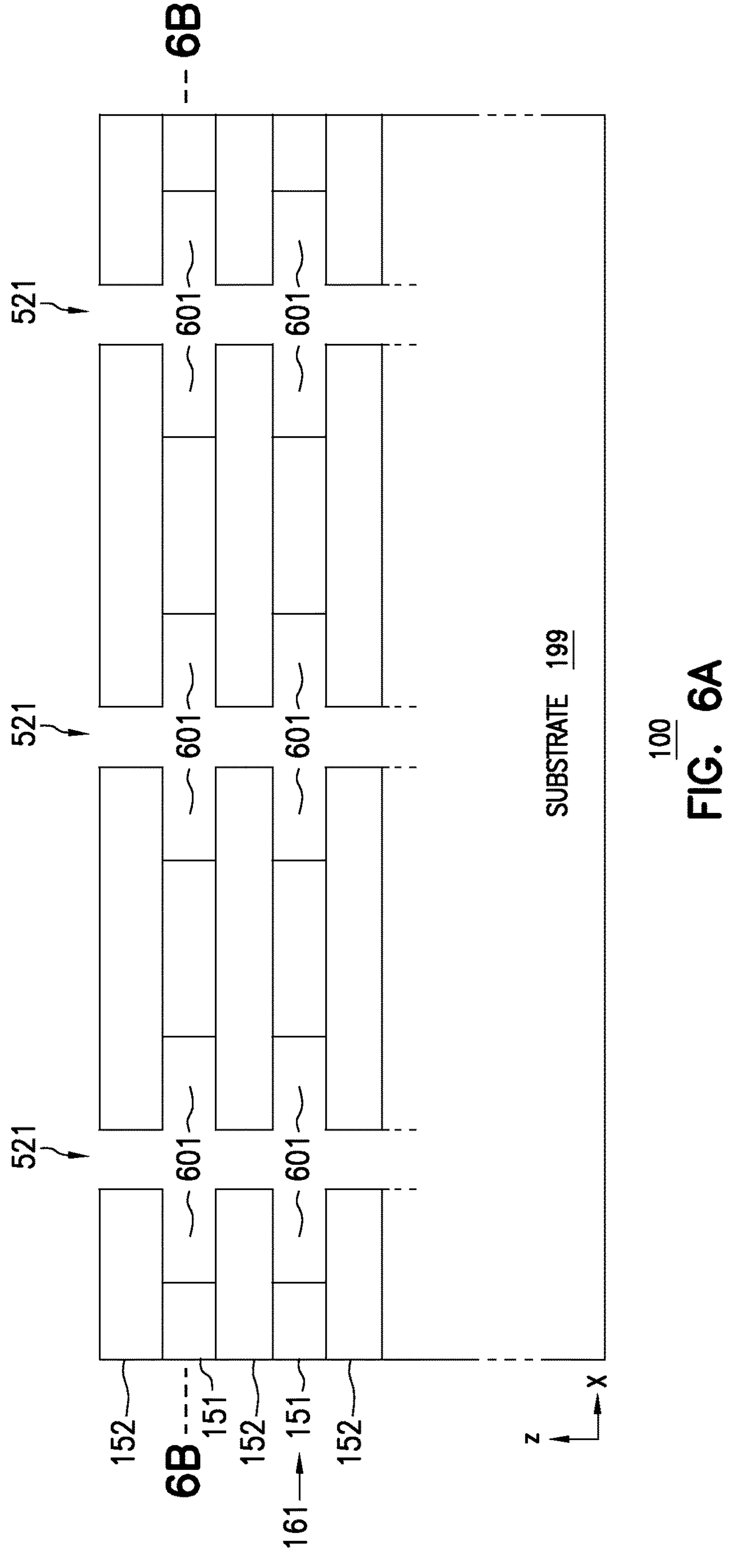
Figure 6B:
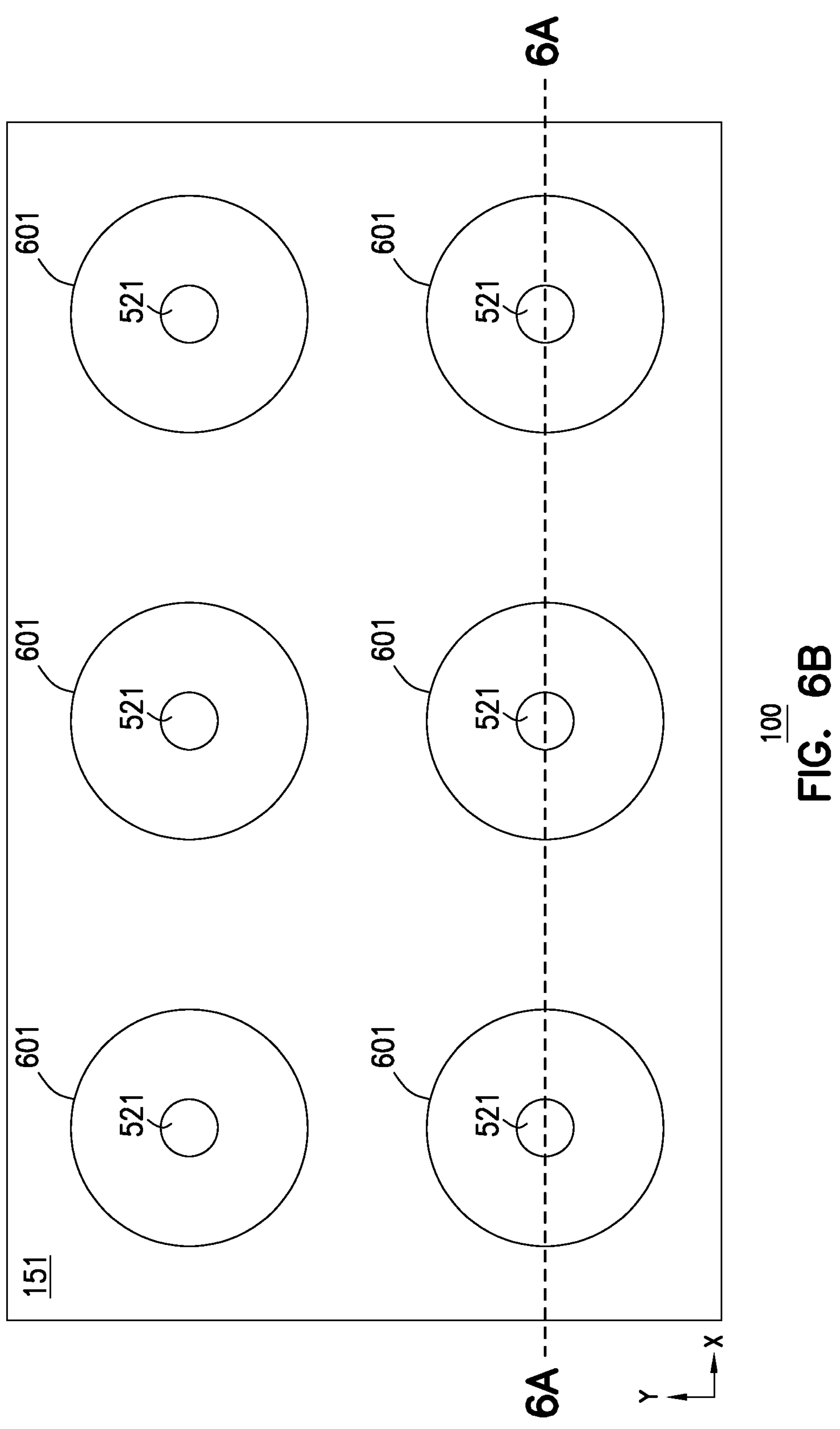

FIG. 6A and FIG. 6B show memory device 100 after recesses 601 are formed. Forming recesses 601 can include removing at least part of the portion of dielectric materials 151 that are exposed at openings 521 to form recesses 601 at the location where dielectric materials were removed.

Figure 7A:
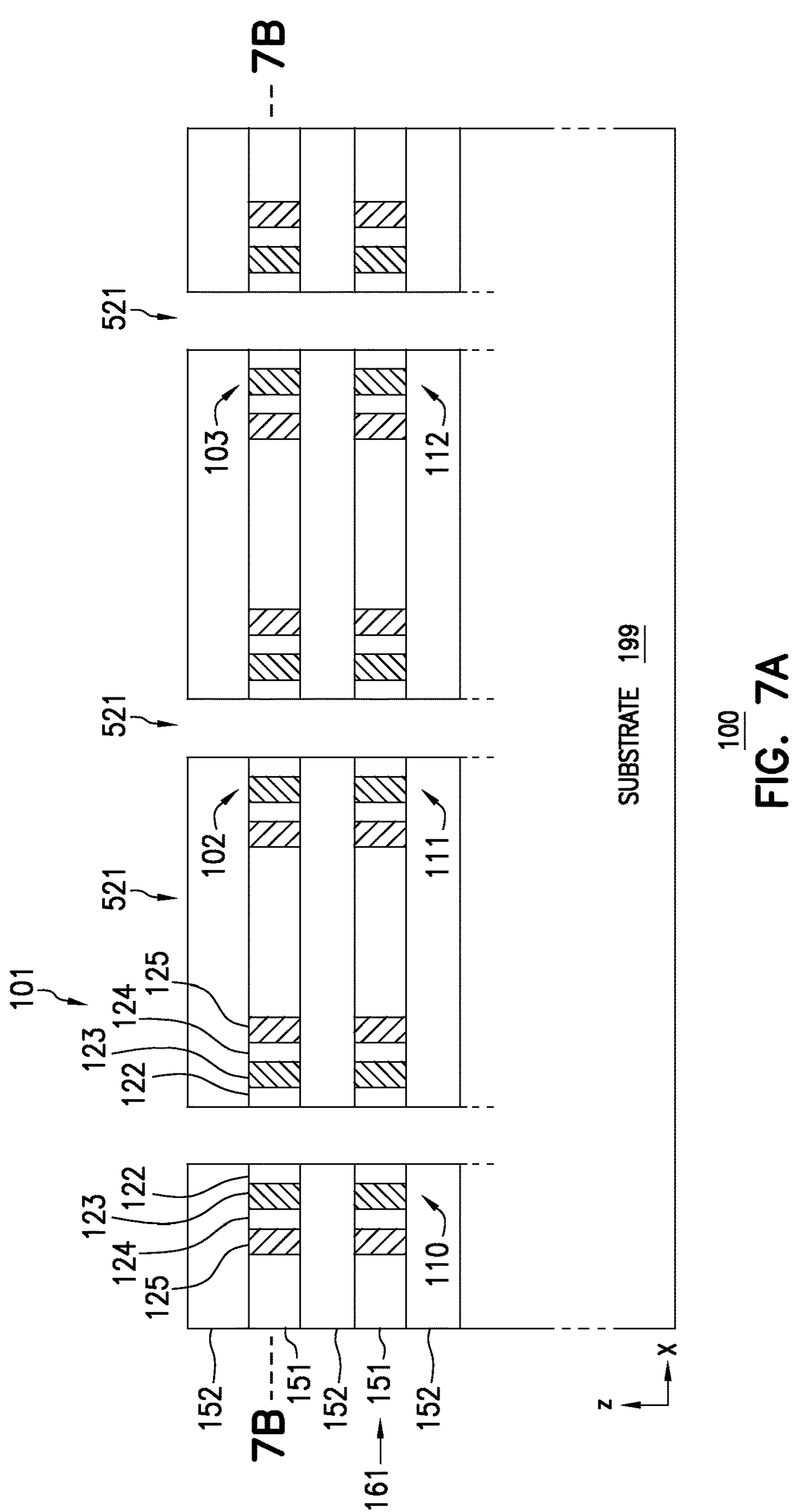
Figure 7B:
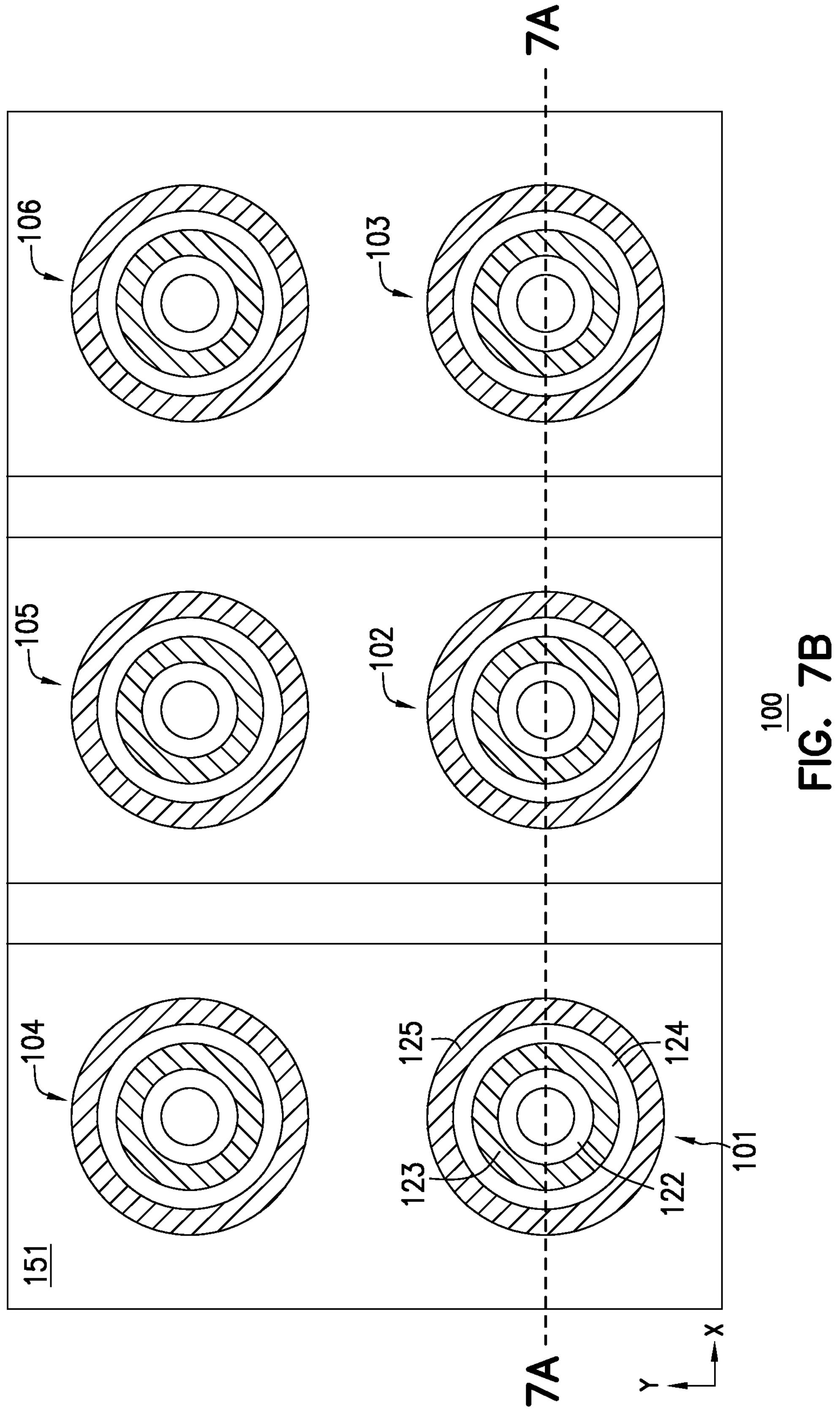

FIG. 7A and FIG. 7B show memory device 100 after memory cells 101 through 106 (and other memory cells, not shown) of memory device 100 are formed in recesses 601. Forming memory cells 101 through 106 can include forming (in each recess 601) a semiconductor material (e.g., polysilicon) adjacent a sidewall (not labeled) of recess 601. The semiconductor material forms semiconductor portion 125. Forming memory cells 101 through 106 can include forming (in each recess 601) forming a dielectric material (e.g., silicon dioxide) adjacent the semiconductor material. The dielectric material forms dielectric portion 124. Forming memory cells 101 through 106 can include forming (in each recess 601) forming a charge storage material (e.g., polysilicon or other material) adjacent the dielectric material. The charge storage material forms charge storage structure 123. Forming memory cells 101 through 106 can include forming (in each recess 601) forming a ferroelectric material adjacent the charge storage material. The ferroelectric material forms ferroelectric portion 122. Forming the elements of memory cells 101 through 106 can be performed sequentially in the order described here. For example, forming each of memory cells 101 through 106 includes forming semiconductor portion 125, forming dielectric portion 124 after forming semiconductor portion 125, forming charge storage structure 123 and forming dielectric portion 124, and forming ferroelectric portion 122 after forming charge storage structure 123.

As shown in FIG. 7A, each memory cell (e.g., memory cell 101) can include semiconductor portion 125 adjacent a sidewall of a respective recess 601, a dielectric portion 124 adjacent the semiconductor portion 125, a charge storage structure 123 adjacent dielectric portion 124, and a ferroelectric portion 122 adjacent dielectric portion 124.

Figure 8A:
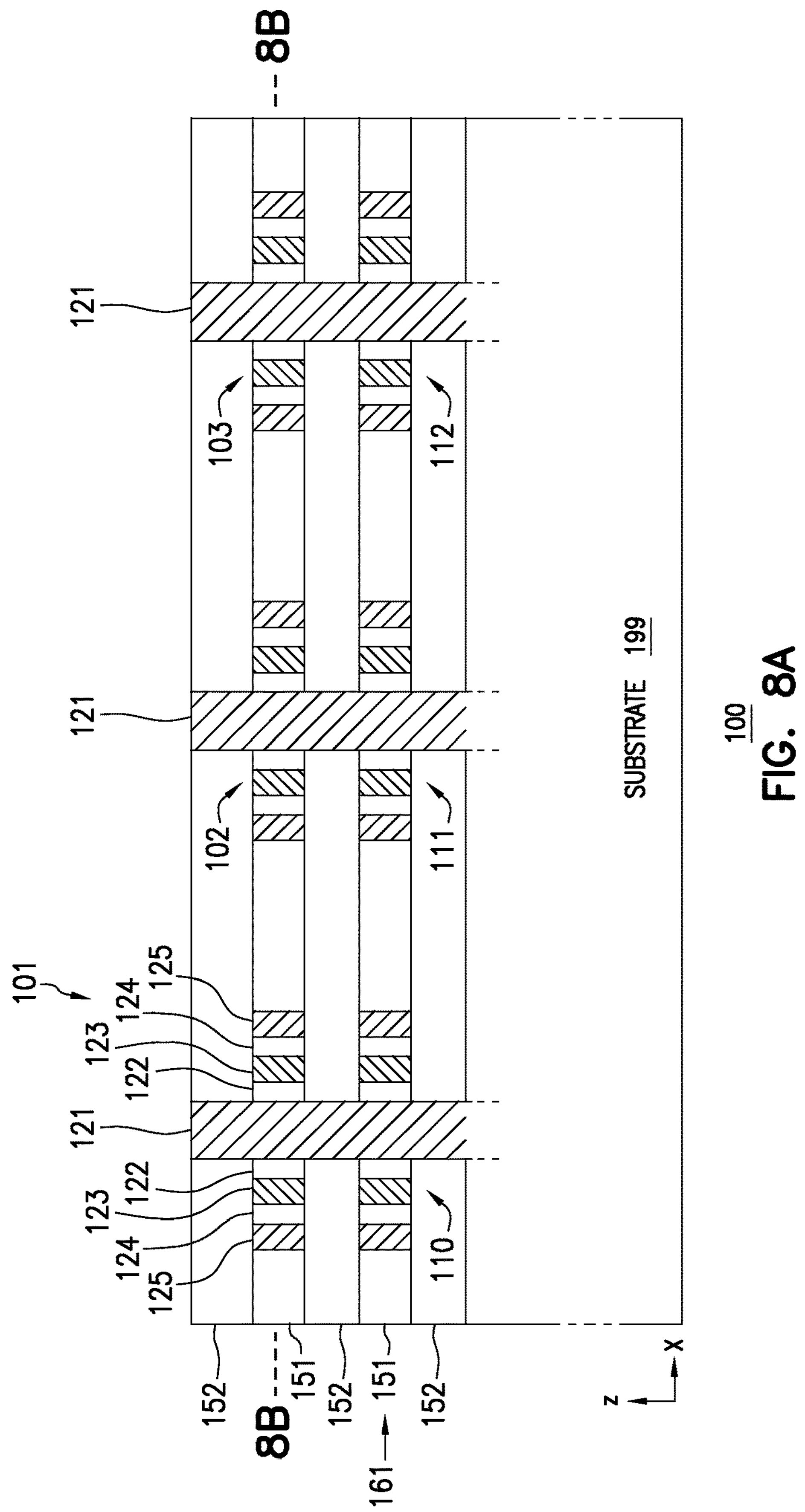
Figure 8B:
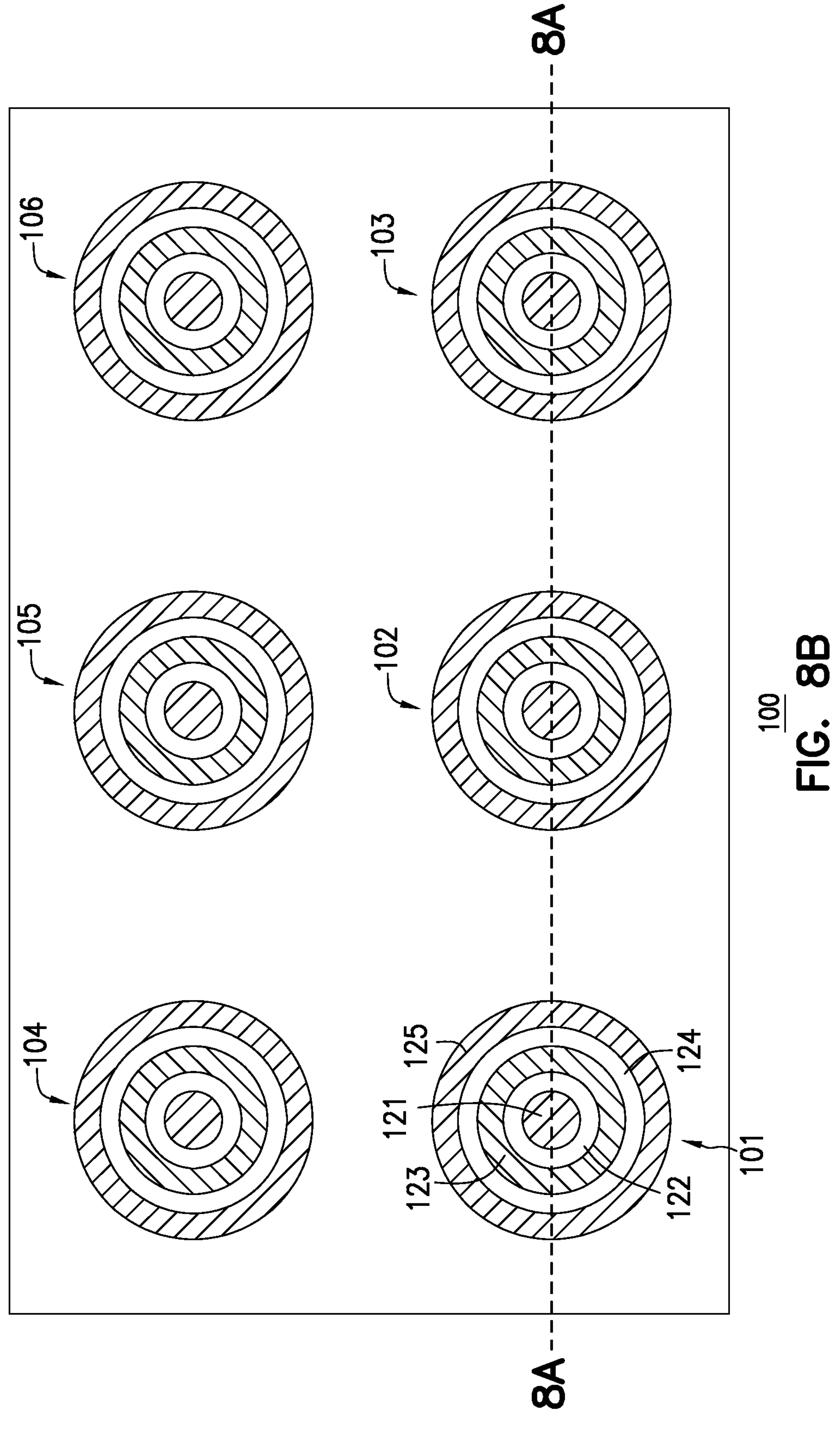

FIG. 8A and FIG. 8B show memory device 100 after conductive structures 121 are formed in recesses 601 and adjacent ferroelectric portion 122. Forming conductive structures 121 can include depositing a conductive material in recesses 601 after ferroelectric portion 122 is formed. The conductive materials can include metal, doped polysilicon, or other conductive materials.

Figure 9A:
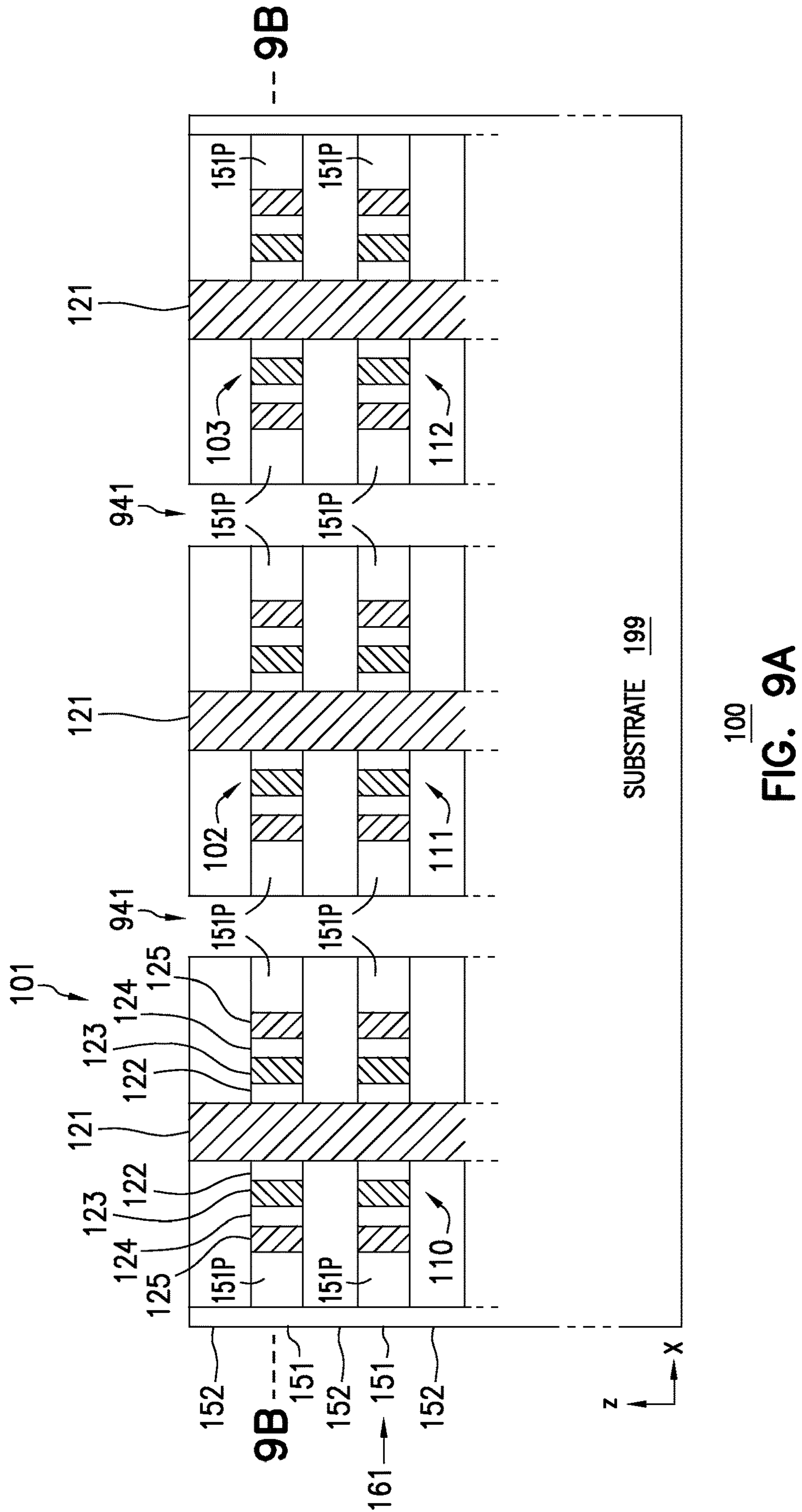
Figure 9B:
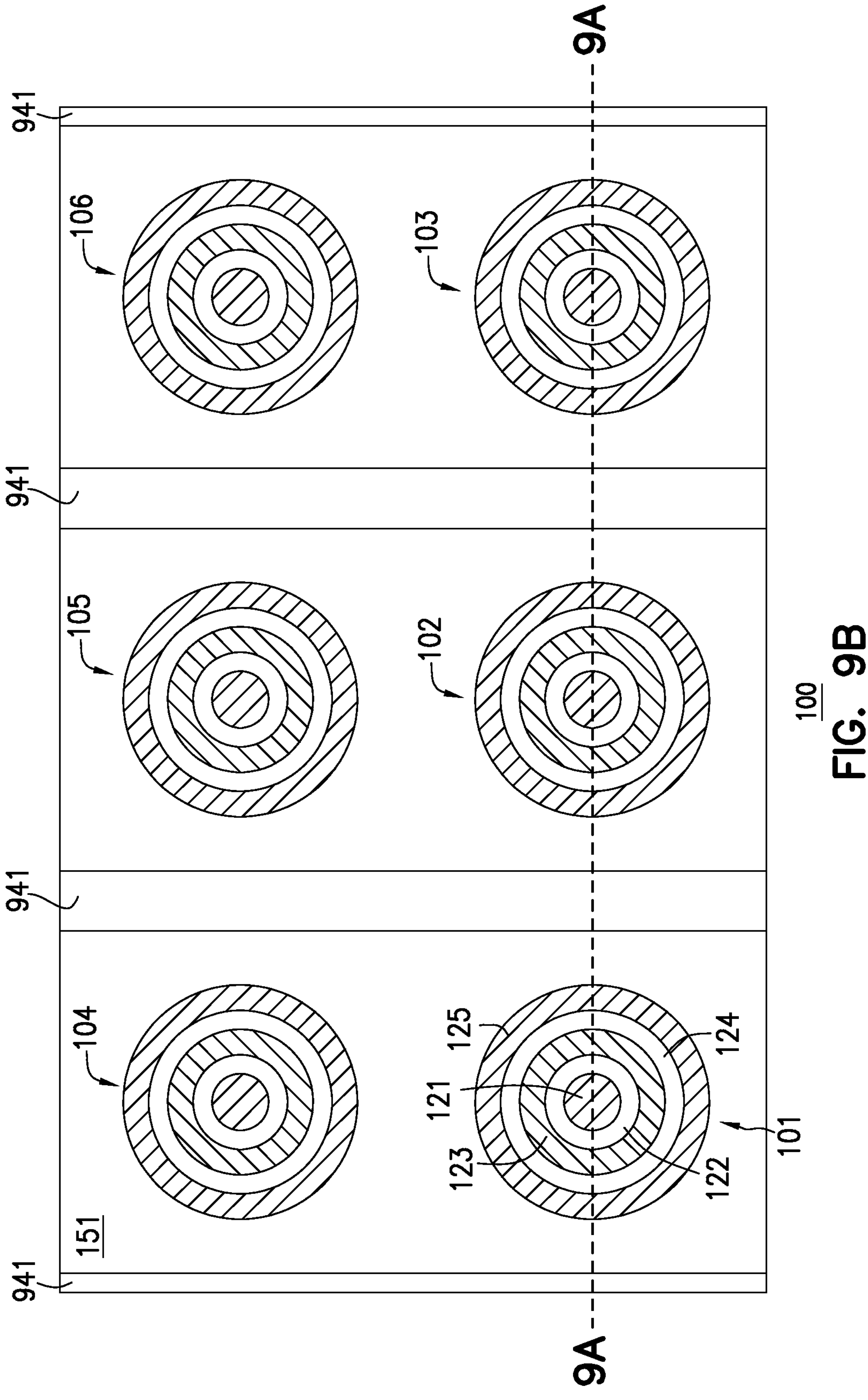

FIG. 9A and FIG. 9B show memory device 100 after trenches (e.g., slots) 941 are formed. As shown in FIG. 9B, each trench 941 can have a length in the Y-direction, which is a direction perpendicular to a direction from one of the levels of dielectric material 151 to one of the levels of dielectric materials 152. Forming trenches 941 can including removing a portion of dielectric materials 151 and 152 between adjacent of groups of memory cells in the X-direction. For example, as shown in FIG. 9A and FIG. 9B, a trench 941 can be formed between a group that includes memory cells 101 and 110 and a group that includes memory cells 102 and 111. In another example, as shown in FIG. 9A and FIG. 9B, a trench 941 can be formed between a group that includes memory cells 102 and 111 and a group that includes memory cells 103 and 112.

The process associated with FIG. 9A and FIG. 9B can also include removing portions 151P of dielectric materials 151 to expose a portion (e.g., sidewall) 125W (labeled in FIG. 10A and FIG. 10B) of semiconductor portion 125 of each of memory cells 101, 102, 103, 110, 111, and 112. Exposing portion 125W (labeled in FIG. 10A and FIG. 10B) allows a respective conductive structure (e.g., part of a data line) to form adjacent (and make electrical contact with) a respective semiconductor portion 125 of a respective memory cell.

Figure 10A:
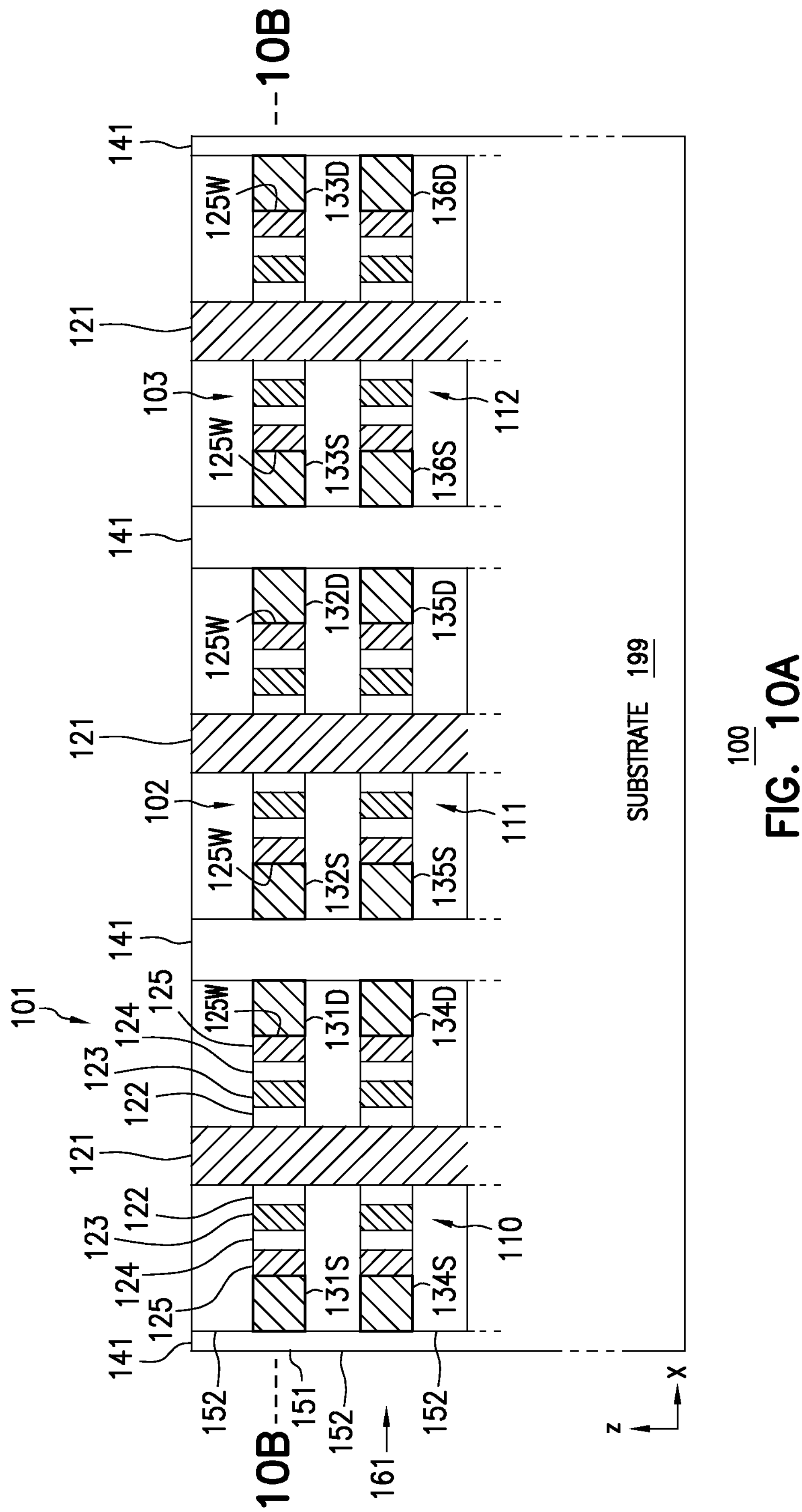
Figure 10B:
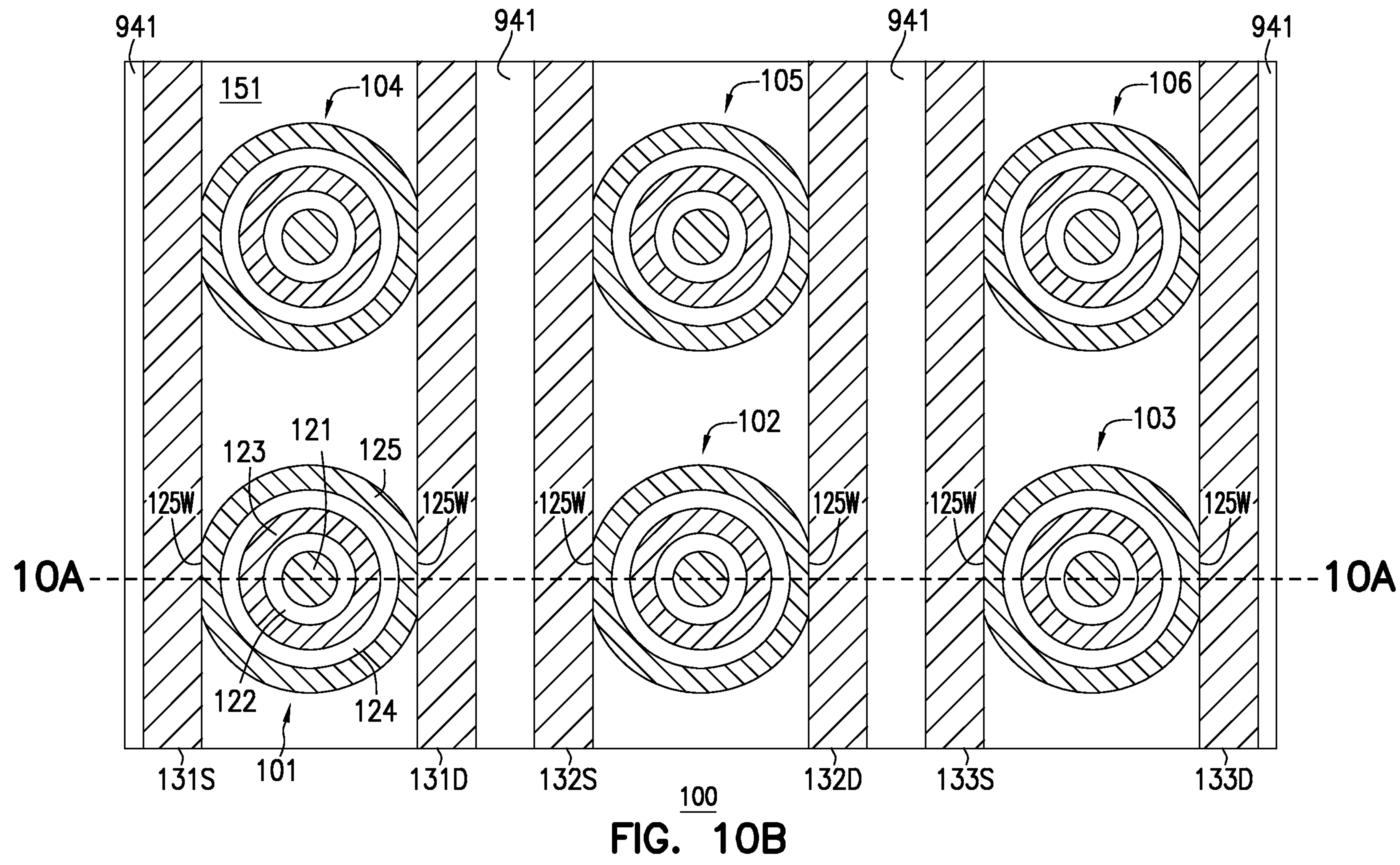

FIG. 10A and FIG. 10B show memory device 100 after conductive structures 131S, 131D, 132S, 132D, 133S, 133D, 134S, 134D, 135S, 135D, 136S and 136D are formed adjacent (and make electrical contact with) respective semiconductor portions (e.g., channel regions) of respective memory cells 101, 102, 103, 110, 111, and 112. FIG. 10A and FIG. 10B also show memory device 100 after dielectric structures 141 in trenches 941 between respective conductive structures 131S, 131D, 132S, 132D, 133S, 133D, 134S, 134D, 135S, 135D, 136S and 136D.

The description of forming memory device 100 with reference to FIG. 4A through FIG. 10B can include other processes to form a complete memory device (e.g., memory device 100). Such processes are omitted from the above description so as to not obscure the subject matter described herein.

The illustrations of apparatuses (e.g., memory device 100) and methods (e.g., method of forming memory device 100) are intended to provide a general understanding of the structure of various embodiments and are not intended to provide a complete description of all the elements and features of apparatuses that might make use of the structures described herein. An apparatus herein refers to, for example, either a device (e.g., memory device 100) or a system (e.g., an electronic item that can include memory device 100).

Any of the components described above with reference to FIG. 1 through FIG. 10B can be implemented in a number of ways, including simulation via software. Thus, apparatuses (e.g., memory device 100) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory device 100) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10B include apparatuses and methods of forming the apparatuses. One of the apparatuses includes a conductive structure; a ferroelectric portion encircling the conductive structure; a charge storage structure encircling the ferroelectric portion; a dielectric portion encircling the charge storage structure; a semiconductor portion encircling the dielectric portion; a first additional conductive structure adjacent a first side of the semiconductor portion; and a second additional conductive structure adjacent a second side of the semiconductor portion, wherein a direction from the first additional conductive structure to the second additional conductive structure is perpendicular to a direction of a length of the conductive structure. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third," etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description. type

What is claimed is:

1. An apparatus comprising:

a conductive structure;

a ferroelectric portion encircling the conductive structure;

a charge storage structure encircling the ferroelectric portion;

a dielectric portion encircling the charge storage structure;

a semiconductor portion encircling the dielectric portion;

a first additional conductive structure adjacent a first side of the semiconductor portion; and a second additional conductive structure adjacent a second side of the semiconductor portion, wherein a direction from the first additional conductive structure to the second additional conductive structure is perpendicular to a direction of a length of the conductive structure.

2. The apparatus of claim 1, wherein the conductive structure is part of an access line of the apparatus.

3. The apparatus of claim 1, wherein the first additional conductive structure is part of a data line of the apparatus.

4. The apparatus of claim 1, wherein:

the first additional conductive structure and the second additional conductive structures are separated from each other by a first additional dielectric portion adjacent a third side of the semiconductor portion;

the first additional conductive structure and the second additional conductive structures are separated from each other by a second additional dielectric portion adjacent a fourth side of the semiconductor portion; and a direction from the first side of the semiconductor portion to the second side of the semiconductor portion is perpendicular to a direction from the third side of the semiconductor portion to the fourth side of the semiconductor portion.

5. The apparatus of claim 1, wherein the semiconductor portion is part of a transistor of the apparatus, and part of the first additional conductive structure is part of a source or a drain of the transistor.

6. The apparatus of claim 1, wherein the charge storage structure forms a floating gate of a transistor of the apparatus.

7. The apparatus of claim 1, wherein the semiconductor portion is part of a channel region of a transistor of the apparatus, and part of the conductive structure forms a gate of the transistor.

8. The apparatus of claim 1, wherein the charge storage structure and the conductive structure have a same material.

9. The apparatus of claim 1, further comprising:

a first level of dielectric material adjacent a first side of each of the ferroelectric portion, the charge storage structure, the dielectric portion, and the semiconductor portion; and a second level of dielectric material adjacent a second side of each of the ferroelectric portion, the charge storage structure, the dielectric portion, and the semiconductor portion.

10. The apparatus of claim 9, wherein the first level of dielectric material and the second level of dielectric material have a same dielectric material.

11. The apparatus of claim 1, further comprising:

a first level of silicon nitride adjacent a first side of each of the ferroelectric portion, the charge storage structure, the dielectric portion, and the semiconductor portion; and a second level of silicon nitride adjacent a second side of each of the ferroelectric portion, the charge storage structure, the dielectric portion, and the semiconductor portion.

12. An apparatus comprising:

tiers located one over another, each of the tiers including memory cells, the tiers including a first tier and a second tier;

a first conductive structure extending through the tiers;

a first memory cell included in the memory cells of the first tier, the first memory cell including:

a first ferroelectric portion adjacent a first portion of the first conductive structure;

a first charge storage structure adjacent the first ferroelectric portion;

a first dielectric portion adjacent the first charge storage structure; and a first semiconductor portion adjacent the first dielectric portion;

a second memory cell included in the memory cells of a second tier of the tiers, the second memory cell including:

a second ferroelectric portion adjacent a second portion of the first conductive structure;

a second charge storage structure adjacent the second ferroelectric portion;

a second dielectric portion adjacent the second charge storage structure; and a second semiconductor portion adjacent the second dielectric portion;

a first additional conductive structure located in the first tier and adjacent a first side of the first semiconductor portion;

a second additional conductive structure located in the first tier and adjacent a second side of the first semiconductor portion;

a third additional conductive structure located in the second tier and adjacent a first side of the second semiconductor portion; and a fourth additional conductive structure located in the second tier and adjacent a second side of the second semiconductor portion, wherein each of the first, second, third, and fourth additional conductive structures has a length perpendicular to a direction from the first tier to the second tier.

13. The apparatus of claim 12, wherein the first ferroelectric portion is separated from the second ferroelectric portion by a dielectric material.

14. The apparatus of claim 12, wherein the first charge storage structure is separated from the second charge storage structure by a dielectric material.

15. The apparatus of claim 12, wherein the first semiconductor portion is separated from the second semiconductor portion by a dielectric material.

16. The apparatus of claim 12, further comprising:

a dielectric structure including a first side adjacent the first additional conductive structure and the third additional conductive structure, and a second side adjacent the second additional conductive structure and the fourth additional conductive structure.

17. A method comprising:

forming levels of first dielectric materials interleaved with levels of second dielectric materials;

forming an opening through the levels of first dielectric materials and the levels of second dielectric materials to expose, at the opening, a portion of a level of dielectric material among the levels of first dielectric materials and the levels of second dielectric materials;

removing at least part of the portion of the level of dielectric material to form a recess in the level of dielectric material; and forming a memory cell in the recess, including:

forming a semiconductor material in the recess;

forming a dielectric material adjacent the semiconductor material;

forming a charge storage material adjacent the dielectric material;

forming a ferroelectric material adjacent the charge storage material;

forming a conductive material in adjacent the dielectric material; and forming an additional conductive material adjacent the semiconductor material.

18. The method of claim 17, wherein the first dielectric materials include silicon dioxide, and the levels of second dielectric materials include silicon nitride.

19. The method of claim 17, wherein the level of dielectric material is one of the levels of the first dielectric materials.

20. The method of claim 17, wherein forming the additional conductive material includes:

removing a portion of the levels of first dielectric materials and the levels of second dielectric materials to expose a portion the semiconductor material; and forming the additional conductive material such that the additional conductive material contacts the portion of the semiconductor material.

21. The method of claim 20, wherein removing the levels of first dielectric materials and the levels of second dielectric materials includes forming a trench in the levels of first dielectric materials and the levels of second dielectric materials.

22. The method of claim 21, wherein the trench has length in a direction perpendicular to a direction from one of the levels of first dielectric materials to one of the levels of second dielectric materials.

23. A method comprising:

forming levels of first dielectric materials interleaved with levels of second dielectric materials;

forming a first opening and a second opening through the levels of first dielectric materials and the levels of second dielectric materials to expose a first portion of a level of dielectric material among the levels of first dielectric materials and the levels of second dielectric materials, and to expose a second portion of the level of dielectric material at the second opening;

removing at least part of the first portion to form a first recess in the level of dielectric material, and removing at least part of the second portion to form a second recess in the level of dielectric material;

forming, in each of the first and second recesses, a semiconductor material, a dielectric material adjacent the semiconductor material, a charge storage material adjacent the dielectric material, a ferroelectric material adjacent the charge storage material, and a conductive material adjacent the dielectric material;

removing a portion of the levels of first dielectric materials interleaved with the levels of second dielectric materials to expose a portion of the semiconductor material formed in the first recess and a portion of the semiconductor material formed in the second recess;

forming a first conductive material adjacent the portion of the semiconductor material in the first recess; and forming a second conductive material adjacent the portion of the semiconductor material in the second recess.

24. The method of claim 23, wherein the levels of first dielectric materials include silicon dioxide, and the levels of second dielectric materials include silicon nitride.

25. The method of claim 24, wherein the level of dielectric material is one of the levels of first dielectric materials.

26. The method of claim 25, wherein the first and second conductive materials are formed on a same level as the level of dielectric material.

27. The method of claim 23, wherein removing the portion of the levels of first dielectric materials interleaved with the levels of second dielectric materials includes forming a trench in the portion of the levels of first dielectric materials interleaved with the levels of second dielectric materials.

* * * * *